United States Patent [19]

Martan

[11] 4,048,034
[45] Sept. 13, 1977

[54] PHOTOPOLYMERIZATION USING AN ALPHA-AMINOACETOPHENONE

[75] Inventor: Michael Martan, Skokie, Ill.

[73] Assignee: UOP Inc., Des Plaines, Ill.

[21] Appl. No.: 718,293

[22] Filed: Aug. 27, 1976

[51] Int. Cl.$^2$ ............................ C08F 2/46; C08F 4/00
[52] U.S. Cl. .......................... 204/159.23; 204/159.15; 204/159.18; 96/115 P
[58] Field of Search ...................... 204/159.23, 159.15, 204/159.18; 96/115 P

[56] References Cited

U.S. PATENT DOCUMENTS

| 3,549,367 | 12/1970 | Chang et al. | 96/35.1 |
|---|---|---|---|
| 3,615,455 | 10/1971 | Laridon et al. | 96/35.1 |
| 3,756,827 | 9/1973 | Chang | 96/86 P |

*Primary Examiner*—Richard B. Turer
*Attorney, Agent, or Firm*—James R. Hoatson, Jr.; Raymond H. Nelson; William H. Page, II

[57] ABSTRACT

Polymerizable monomers are photopolymerized by subjecting the monomer to the emission from an ultraviolet light source in the presence of a photosensitizing compound and an activating compound. It has now been discovered that certain types of substituted acetophenones will act as both a sensitizer and an activator thus eliminating the presence of more than one compound in the monomer.

10 Claims, No Drawings

PHOTOPOLYMERIZATION USING AN ALPHA-AMINOACETOPHENONE

BACKGROUND OF THE INVENTION

It is known in the prior art that aromatic ketones such as acetophenone, benzophenone, benzoin ethers or chlorothioxanthones are used as photosensitizers for the polymerization of polymerizable monomers such as vinyl monomers. For example, U.S. Pat. No. 3,374,160 discloses the use of ortho-bromoacetophenone as a photosensitizer. Other prior art references use some special classes of acetophenones which possess ether groups which are either alpha to the carbonyl group, or possess halomethyl groups which are alpha to the carbonyl group or which possess halmethyl groups attached to the aromatic ring. However, acetophenones which possess ether groups alpha to the carbonyl group are relatively difficult to prepare and thus, will be relatively expensive to use. Likewise, acetophenones which possess a halomethyl group alpha to the carbonyl group or which possess a halomethyl group attached to the aromatic ring are unstable and, in addition, possess lacrimogynic properties which severely limited use of these compounds.

While the above compounds are used as photosensitizers, it is also necessary to utilize activating compounds in combination with the acetophenones. These initiating compounds usually comprise an amine such as dimethyl ethanol amine, diethyl ethhanol amine, etc.

In contradistinction to this, it has now been discovered that by utilizing a certain class of substituted acetophenones and particularly alpha-aminoacetophenones of a type hereinafter set forth in greater detail, it is possible to effect the photopolymerization of polymerizable monomers in the presence of only one type of compound, said compound acting as both an initiator and a sensitizer.

SPECIFICATION

This invention relates to the use of substituted acetophenones in the photopolymerization of polymerizable monomers. More specifically, the invention is concerned with the use of alpha-aminoacetophenones which act as both sensitizers and activators in the polymerization of vinyl monomers.

The most commonly used coatings and inks comprise solutions of polymeric solutions dissolved in a solvent. Thereafter the coating film is formed by evaporating the solvent followed by a thermal treatment. This treatment induces the decomposition of a free radical catalyst which is present in the monomer which cross-links the polymeric chains to form a rapid structure. Due to the need and desire to reduce energy consumption as well as reduced pollution, the coating and ink industry have developed solventless coatings and inks. These solventless coatings and printing inks which contain a photosensitizer are cured by subjecting the resin to ultraviolet radiation which possesses a wave length less than about 4000 Angstroms. The polymeric resins are dissolved in liquid monomers which are incorporated in the final film, rather than being dissolved in a solvent which is volatilized into the air or atmosphere, thus creating a pollution problem. The photosensitizer which is present in the monomer absorbs the radiation from the ultra-violet light source thus resulting in the formation of free radicals which cure the liquid resin into a film. In addition, as hereinafter set forth, the prior art utilizes an activator or promoter compound which usually comprises a low boiling material. This promoter also causes a problem in the processing of the films inasmuch as it will tend to volatilize thereby causing corrosion problems in the apparatus or else it will be toxic in nature in the atmosphere.

In addition to the disadvantages of using relative low boiling materials as sensitizers and initiators or activators, it is also necessary that the compounds do not cause a color problem which would inhibit or discourage the use of these compounds in colorless resins. For example, Michler's ketone (p,p'-bisdimethylaminobenzophenone) in which the amino groups are directly attached to the aromatic rings causes the product to be colored. This limits its use in colorless resins as well as colored coatings whereby the desired color may be changed due to the action of the aforesaid ketone.

It is therefore an object of this invention to provide an improved process for the photopolymerization of vinyl monomers.

A further object of this invention is to provide an improvement in the process for the photopolymerization of polymerizable monomers by utilizing a compound which acts as both a photosensitizer and an activator.

Taken in its broadest aspect, an embodiment of this invention resides in a process for the photopolymerization of a polymerizable monomer wherein said monomer is subjected to the emission from an ultra-violet light source having a wave length less than about 4000 Angstroms in the presence of a photosensitizing compound and an activating compound at polymerization conditions, the improvement which comprises utilizing an alpha-aminoacetophenone as a combined photosensitizing compound and an activating compound.

A specific embodiment of this invention is found in a process for the photopolymerization of a polymerizable monomer wherein said monomer is subjected to the emission from an ultra-violet light source having a wave length less than about 4000 Angstroms at a temperature in the range of from about ambient to about 100° C. and a pressure in the range of from about atmospheric to about 100 atmospheres in the presence of alpha-dimethylaminoacetophenone.

Other objects and embodiments will be found in the following further detailed description of the present invention.

As hereinafter set forth the present invention is concerned with an improvement is a process for the photopolymerization of polymerizable monomers. The improvement comprises utilizing, as a combind photosensitizer and photoactivator, an alpha-aminoacetophenone. The polymerizable monomers which are subjected to photopolymerizaion may be utilized in a variety of ways. As previously mentioned, a particularly important use of these monomers is as coatings and inks. Other uses will include the resins as part of aircraft canopies and windows, automotive instrument dials, tail light lenses, lighting fixtures, refrigerator parts, contact lenses and optical parts, surgical instruments, safety glass, etc. Prior art aromatic ketones such as benzophenone may be used as a photosensitizer only in clear coatings inasmuch as in pigments coatings or inks most of the ultra-violet light is absorbed by the pigment of color and thus the efficiency of the photosensitizer is greatly reduced. Consequently in order to cure pigmented or colored resins relatively large amounts of benzophenone or other aromatic ketones which possess high extinction coefficients in the ultra-violet spectrum of high pressure mercury lamps are used. Such products as the benzoin ethers or chlorothioxanthones are relatively expensive and therefore the final cost of the finished product will be higher. In addition, the cost of the finished product will also include the use of activator compounds such as secondary or tertiary amines which provide the hydrogen molecules for the ketone initiators. In contradistinction to this, it has now been discovered that by utilizing an alpha-aminoacetophenone of the type hereinafter set forth in greater detail it is possible to effect the photopolymerization of the polymerizable monomers in a relatively inexpensive manner, said aminoacetophenone acting as both the initiator and the photosensitizer for the polymerization process.

Examples of polymerizable monomers which may undergo photopolymerization by exposure to the emission from an ultra-violet light source which possesses a wave length less than about 4000 Angstroms will include acrylic acid, methacrylic acid, esters of these acids such as methyl acrylate, ethyl acrylate, methyl methacrylate, ethyl methacrylate, etc., styrene, styrene and unsaturated polyesters, etc., pentaerythritol triacrylate (PTEA), trimethylolpropane triacrylate (TMPTA), 1,6-hexanediol diacrylate, etc.

The alpha-aminoacetophenones which are utilized as a combined photosensitizer and initiator will comprise those compounds having the generic formula:

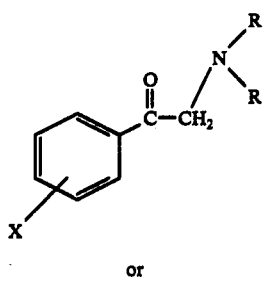

or

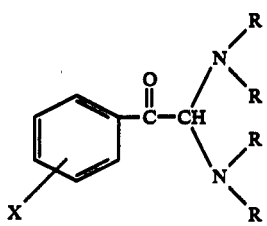

in which R is selected from the group consisting of alkyl radicals containing from 1 to about 9 carbon atoms, cycloalkyl, aryl, aralkyl, or alkaryl radicals and X is hydrogen, halogen or an alkyl group containing from 1 to about 4 carbon atoms. Some specific examples of these compounds will include alpha-dimethylaminoacetophenone, alpha-diethylaminoacetophenone, alpha-dipropylaminoacetophenone, alpha-dibutylaminoacetophenone, alpha-dipentylaminoacetophenone, alpha-dihexylaminoacetophenone, alpha-diheptylaminoacetophenone, alpha-dioctylaminoacetophenone, alpha-dinonylaminoacetophenone, alpha-diphenylaminoacetophenone, alpha-dibenzylaminoacetophenone, alpha-di-p-tolylaminoacetophenone, alpha-dicyclopentlyaminocetophenone, alpha-dicyclohexylaminoacetophenone, alpha-dicycloheptylaminoacetophenone, alpha-dimethylamino-p-chloroacetophenone, alpha-dipropylamino-p-chloroacetophenone, alpha-dipentylamino-p-chloroacetophenone, alpha-diheptylamino-p-chloroacetophenone, alpha-dinonylamino-p-chloroacetophenone, alpha-dibenzylamino-p-chloroacetophenone, alpha-dicyclopentylamino-p-chloroacetophenone, alpha-dicycloheptylamino-p-chloroacetophenone, alpha-diethylamino-p-bromoacetophenone, alpha-dibutylamino-p-bromoacetophenone, alpha-dihexylamino-p-bromoacetophenone, alpha-dioctylamino-p-bromoacetophenone, alpha-diphenylamino-p-bromoacetophenone, alpha-di-p-tolylamino-p-bromoacetophenone, alpha-dicyclohexylamino-p-bromoacetophenone, alpha-tetramethyl-diaminoacetophenone, alpha-tetraethyl-diaminoacetophenone, alpha-tetrapropyl-diaminoacetophenone, alpha-tetrabutyl-diaminoacetophenone, alpha-tetracyclohexyl-diaminoacetophenone, alpha-tetraphenyl-diaminoacetophenone, alpha-tetrabenzyl-diaminoacetophenone, alpha-tetramethyldiamino-p-chloroacetophenone, alpha-tetraethyldiamino-p-bromoacetophenone, etc. It is to be understood that the aforementioned alpha-aminoacetophenones are only representative of the class of compounds which may be utilized as a combined photosensitizer and activator and that the present invention is not necessarily limited thereto.

The photopolymerization of the vinyl monomer is effected by subjecting said monomer to the action resulting from the emission of a light source which is in the ultra-violet range, that is, the emission being less than about 4000 Angstroms. The ultra-violet light source which possesses a wave length less than about 4000 Angstroms and preferably less than about 3500 Angstroms may be selected from any source. One particular light source which may be utilized to effect the process of the present invention comprises a medium pressure mercury arc lamp. These mercury arc lamps possess strong emission lines at 2537 Angstroms, 2900 Angstroms and 3660 Angstroms, among others. It is also contemplated that a low pressure mercury arc lamp may be used. In addition, another light souce which may be utilized to effect the photosensitized polymerization of the vinyl monomer comprises a specifically prepared fluorescent light which will also emit energy at a desired wave length, that is, a large portion of the wave length being no greater than 3700 Angstroms. The photopolymerization conditions of temperatures and pressure which are utilized in this reaction may vary over a relatively wide range. For example, the temperature at which the reaction is effected may vary from ambient (about 20°-25° C.) up to about 100° C. or more while pressures ranging from atmospheric to about 100 atmospheres may be employed.

The process of this invention may be effected in any suitable manner and may comprise either a batch or continuous type operation. When utilizing a batch type operation, a quantity of vinyl monomer which is to undergo photopolymerization is placed in an appropriate apparatus along with the alpha-aminoacetophenone which acts as both a photosensitizer and an activator. The particular apparatus which is employed for the photopolymerization reaction may comprise a quartz reactor or a glass reactor, depending upon the wave length of the irradiation emission source. Likewise, the reactor could be metallic if the lamp is positioned inside the reactor. In addition, a reactor made of a synthethic material known in the trade as Vycor may also be employed. The vinyl monomer is then irradiated for a predetermined residence time under polymerization reaction conditions of the type hereinbefore set forth, said residence time being in a range of from about 0.1 to about 10 hours or more in duration. At the end of the residence time, the polymerized product may be recovered if in solid form by dissolving the polymer in a predetermined organic solvent followed by reprecipitation from a dissimilar organic solvent.

It is also contemplated within the scope of this invention that the process described herein may be effected in a continuous manner of operation. When such a type of operation is used, the starting materials comprising the vinyl monomers and the combined photosensitive and activator of the type hereinbefore set forth are continuously charged to a reaction zone comprising a quartz, glass or Vycor reactor which is maintaind at suitable and predetermined operating conditions of temperature and pressure. The solution is thereafter subjected to irradiation from a light source of the type hereinbefore set forth in greater detail while passing through the reactor. Upon completion of the desired residence time, the reactor effluent is continuously withdrawn and recovered. Inasmuch as the polymer which results from the photopolymerization of the vinyl monomer may be sold in nature, it is contemplated that relatively high polymerization conditions of temperature and pressure are employed in order to maintain the polymer in a fluid form so that is may be continuously withdrawn from the reaction zone.

As will be hereinafter shown in greater detail in the appended examples by utilizing an alpha-aminoacetophenone as both a photosensitizer and an activator, it is possible to obtain activities which are comparable to those systems in which a separate photosensitizer and a separate activator are used and are superior to those systems in which only a photosensitizer is used.

The following examples are given for purposes of illustrating the process of this invention. However, it is to be understood that these examples are given merely for purposes of illustration and that said invention is not necessarily limited thereto.

EXAMPLE I

The polymerizable monomer was subjected to a photopolymerization reaction utilizing a photochemical reactor in which a quartz tube which possessed an inner diameter of 0.4 cm and a length of 30 cm was placed in the center thereof. The monomer which comprised methyl methacrylate was exposed to the emission from an ultra-violet light source consisting of a high pressure mercury lamp which possesed a wave length of 3570 Angstroms. In order to prevent complete solidification of the polymer, the reaction was usually stopped after a conversion of from 20–40%. At the end of the reaction time, the polymer was recovered by dissolving the contents of the tube in acetone and reprecipitating the polymer in 200 cc of methyl alcohol. The rate of polymerization was measured by following the rate of the volume contraction ($\Delta V$) which occurs during the conversion of the monomer units to the polymeric chain. By plotting the $\Delta V$ as a function of time, the slope of the graph indicated the activity of the photosensitizer, a contraction of 20% being approximately equivalent to complete polymerization. During the polymerization reaction, the rate of polymerization was followed by the rate of contraction measured with a cathetometer which accurately followed the liquid level in the polymerization tube.

In the first test, acetophenone was added in an amount of 1% by weight to the methyl methacrylate and the slope was measured in accordance with the above paragraph. The results of this first experiment were recorded in the table as Experiment A. In the second experiment, the methyl methacrylate contained 1% by weight of acetophenone and 1% by weight of an activator comprising dimethyl ethanol amine. The results of this polymerization rate were recorded in the following table as Experiment B.

In a third experiment the methyl methacrylate which was subjected to photopolymerization contained 1% by weight of benzophenone and 1% by weight of an activator comprising dimethyl ethanol amine. This experiment was listed as C.

To illustrate the efficiency of the compounds of the present invention, three further experiments were performed in which methyl methacrylate was again subjected to photopolymerization by exposure to emission from ultra-violet light having a wave length of about 3570 Angstroms. In Experiment D the compound which acted as both a photosensitizer and an activator was alpha-diethylaminoacetophenone. In Experiment E the added compound comprised 1% by weight of alpha-diethylamino-p-chloroacetophenone while in Experiment F the additive comprised 1% by weight of alpha-diethylamino-p-bromoacetophenone. The results of these photopolymerization tests are set forth in Table I.

TABLE I

| Experiment | Sensitizer | Activator | $\Delta V/\Delta t \times 100$ |
|---|---|---|---|
| A | Acetophenone | — | 0.025 |
| B | Acetophenone | DMEA | 1.657 |
| C | Benzophenone | DMEA | 2.6 |
| D | Diethylamino-acetophenone | — | 1.2 |
| E | Diethylamino-p-chloroacetophenone | — | 1.2 |
| F | Diethylamino-p-bromoacetophenone | — | 2.857 |

It is readily apparent from the above table that acetophenone per se without the presence of an activator possessed a very low activity as a photosensitizer while when it was used with an activator comprising DMEA the efficiency became significantly greater. Likewise, benzophenone when used as a photosensitizer in the presence of an activator comprising DMEA possessed a relatively good efficiency. On the other hand, alpha-diethylaminoacetophenone which acted as both a photosensitizer and an activator without the present of an added activator possesed an efficiency similar in nature to that of the combination of acetophenone and DMEA. Likewise, alpha-diethylamino-p-bromoacetophenone without the presence of an added activator possessed an efficiency somewhat greater than the combination of benzophenone which is a widely used photosensitizer in combination with dimethyl ethanol amine. This clearly indicates that the principle of having the chromophoric group and the activation group on the same molecule will permit the use of only one compound in the photopolymerization reaction rather than a combination of at least two dissimilar compounds.

EXAMPLE II

When other polymerizable monomers such as methyl methacrylate or styrene are subjected to a photopolymerization reaction by subjecting said monomer to the emission from an ultra-violet light source which possesses a wave length less than 4000 Angstroms in the presence of a combined photosensitizer and activator such as alpha-dimethylaminoacetophenone or alpha-dimethylamino-p-bromoacetophenone, it will be found that the efficiency of these compounds may be similar in nature to the other alpha-aminoacetophenones set forth in Example I.

I claim as my invention:

1. In a process for the photopolymerization of a polymerizable monomer wherein said monomer is subjected to the emission from an ultra-violet light source having a wave length less than about 4000 Angstroms in the presence of a photosensitizing compound and an activating compound at polymerization conditions, the improvement which comprises utilizing an alpha-aminoacetophenone as combined photosensitizing compound and an activating compound.

2. The process as set forth in claim 1 in which said polymerization conditions include a temperature in the range of from about ambient to about 100° C. and a pressure in the range of from about atmospheric to about 100 atmospheres.

3. The process as set forth in claim 1 in which said polymerizable monomer is methyl methacrylate.

4. The process as set forth in claim 1 in which said polymerizable monomer is methyl acrylate.

5. The process as set forth in claim 1 in which said polymerizable monomer is styrene.

6. The process as set forth in claim 1 in which said alpha-aminoacetophenone is alpha-diethylaminoacetophenone.

7. The process as set forth in claim 1 in which said alpha-aminoacetophenone is alpha-dimethylaminoacetophenone.

8. The process as set forth in claim 1 in which said alpha-aminoacetophenone is alpha-diethylamino-p-chloroacetophenone.

9. The process as set forth in claim 1 in which said alpha-aminoacetophenone is alpha-diethylamino-p-bromoacetophenone.

10. The process as set forth in claim 1 in which said alpha-aminoacetophenone is alpha-dimethylamino-p-bromoacetophenone.

* * * * *